(12) United States Patent
Hein, Jr. et al.

(10) Patent No.: US 6,805,633 B2
(45) Date of Patent: Oct. 19, 2004

(54) GAMING MACHINE WITH AUTOMATIC SOUND LEVEL ADJUSTMENT AND METHOD THEREFOR

(75) Inventors: Marvin Arthur Hein, Jr., Las Vegas, NV (US); James W. Morrow, Sparks, NV (US); Thomas B. Cannon, Plano, TX (US)

(73) Assignee: Bally Gaming, Inc., Las Vegas, NV (US)

( * ) Notice: Subject to any disclaimer, the term of this patent is extended or adjusted under 35 U.S.C. 154(b) by 0 days.

(21) Appl. No.: 10/214,656

(22) Filed: Aug. 7, 2002

(65) Prior Publication Data

US 2004/0029637 A1 Feb. 12, 2004

(51) Int. Cl.[7] .................................................. A63F 13/00
(52) U.S. Cl. ........................ 463/35; 381/57; 273/138.2
(58) Field of Search ........................ 463/35, 30, 16–22, 463/25; 381/56, 57, 104, 107, 108; 273/138.1, 131.2, 143 R, 139

(56) References Cited

U.S. PATENT DOCUMENTS

| | | |
|---|---|---|
| 4,871,176 A | 10/1989 | Knetzger |
| 5,095,798 A | 3/1992 | Okada et al. |
| 5,204,971 A | 4/1993 | Takahashi et al. |
| 5,242,163 A | 9/1993 | Fulton |
| 5,259,613 A | 11/1993 | Marnell, II |
| 5,530,761 A | 6/1996 | d'Alayer de Costemore d'Arc |
| 5,695,188 A | 12/1997 | Ishibashi |
| 5,793,874 A | * 8/1998 | Camire ........................ 381/57 |
| 5,907,622 A | 5/1999 | Dougherty |
| 5,975,528 A | 11/1999 | Halaby |
| 6,196,918 B1 | 3/2001 | Miers et al. |
| 6,302,790 B1 | 10/2001 | Brossard |
| 6,319,125 B1 | * 11/2001 | Acres ........................ 463/25 |
| 6,584,201 B1 | * 6/2003 | Konstantinou et al. ....... 381/57 |
| 6,645,078 B1 | * 11/2003 | Mattice ....................... 463/20 |

OTHER PUBLICATIONS (Author Unknown), Beginners Guide to In–Car Audio, caraudiodiscount.com, pp. 1–3; Aug. 7, 2002.
Chuck Tannert, "Sounds of Seville," Internet Article, pp. 1–3, Aug. 7, 2002.

* cited by examiner

Primary Examiner—Jessica Harrison
Assistant Examiner—Aaron Capron
(74) Attorney, Agent, or Firm—Brown Raysman Millstein Felder & Steiner LLP

(57) ABSTRACT

A system and method for automatically adjusting the sound volume of a gaming machine based on the ambient noise level to an appropriate level. The gaming machine may implement an open loop control algorithm when the machine's sound output is inactive as determined, e.g., by software, or by analyzing samples from a soundboard. A closed loop control algorithm may be implemented when the gaming machine is active. Alternatively, the machine may implement only an open loop algorithm that provides volume adjustment only when the machine's sound output is inactive, in which case the adjusted volume is maintained through an active period, then adjusted again at the next inactive period. A saturation back off feature prevents the sound level of the gaming machine from escalating to, and remains at, a maximum, saturation level.

38 Claims, 11 Drawing Sheets

GAMING MACHINE WITH AUTOMATIC SOUND LEVEL ADJUSTMENT AND METHOD THEREFOR

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The invention generally relates to a method and apparatus for automatically adjusting sound levels and, more particularly, to a method and apparatus for adjusting gaming machine sound volume levels in view of ambient noise levels, such as for a slot machine or other gaming machine in a casino.

BACKGROUND OF THE INVENTION

Playing gaming machines is an enjoyable pastime for many people. Gaming machines include machines that are typically operated by a user by inserting coins, tokens, credit cards, smart cards, tickets or coupons with monetary value. The machines may include, e.g., slot machines, pinball machines, video games and computer stations for playing games alone or with other users, such as bingo, card games and the like. The machines may operate based on both luck and the user's skill. Such gaming machines may be located in casinos, video arcades, gas stations, bars or any other location. Moreover, the machines may be located where they are publicly accessible or in a private location, such as a user's home. Furthermore, the machines may be situated alone or proximate to other gaming machines. The gaming machines may be used for gambling, where the user receives a monetary or other prize when the machine pays off, or simply for amusement.

The sound of a gaming machine can entice a user to begin to play the machine, and to continue to play thereafter. This is particularly important in a gambling environment where a casino or other entity receives revenue from the machines. To entice the user, the machine may play various specified amusing or other enjoyable sounds, including music, at different times, such as when the machine is not being played, when the user begins playing the machine, when a prize is won and so forth.

However, it has been problematic that the sound volume of the gaming machine is not optimized based on the ambient noise of the environment in which it is placed. In particular, the ambient or background noise level in gaming casinos and other locations changes at different times as casino occupancy, gaming machine usage and other factors vary. The ambient noise level also differs by location throughout a casino or other location depending upon numerous factors. For example, a busy area of the casino floor will be louder, e.g., due to people talking and other noise sources, while a less busy corner will be quieter. However, for a gaming machine to attract players it is important for the machine to be easily audible, and for the sound level to otherwise be appropriate for the environment, i.e., not too loud and not too quiet.

Accordingly, there is a need for volume attenuation in a gaming device so as to maximize player attraction and excitement while minimizing player distraction. The present invention clearly fulfills this need.

SUMMARY OF THE INVENTION

The invention provides a method and apparatus for adjusting a gaming machine sound output level automatically based upon the ambient noise level near the machine.

In a particular aspect of the invention, an apparatus is provided for adjusting a level of a sound output of a gaming machine. The apparatus includes means for obtaining data regarding an ambient noise level of an environment in which the gaming machine is located, and adjusting means, responsive to the obtaining means, for adjusting the sound output level of the gaming machine. A sound card or sound adjustment module may be used for monitoring the ambient noise via microphone samples. In one option, software running in the gaming machine provides a signal to the sound card or module to indicate when the gaming machine is inactive, in which case it is known that the microphone samples represent only the ambient noise, with no coupling of the gaming machine sound output. The sound output level can then be adjusted based on the ambient noise level. In another option, the sound card or module determines from the output samples or signals for the speakers when the gaming machine is inactive.

A related method for adjusting a level of a sound output of a gaming machine includes the steps of obtaining data regarding an ambient noise level of an environment in which the gaming machine is located, and adjusting the sound output level of the gaming machine in response to the ambient noise level data.

In another aspect of the invention, an apparatus is provided for equipping a gaming machine to provide an automatic sound adjustment capability, wherein the gaming machine has a sound board that generates an audio signal for exciting at least one speaker. The apparatus includes a module having sound adjustment circuitry, where the module is installed between the soundboard and the speaker, and a microphone installed in a position to monitor an ambient noise level of an environment in which the gaming machine is located. Advantageously, this allows an existing gaming machine to be retrofitted with an automatic sound adjustment capability.

A related method for equipping a gaming machine to provide an automatic sound adjustment capability includes the steps of installing a module having sound adjustment circuitry between the sound board and the gaming machine's speaker(s), and installing a microphone in a position to monitor an ambient noise level of an environment in which the gaming machine is located. The sound adjustment circuitry provides an adjusted audio signal for exciting the speaker(s) based on a signal from the microphone that is indicative of the ambient noise level.

In any approach, a volume adjustment process can be implemented using open loop and/or closed loop control algorithms. In particular, the gaming machine may implement an open loop control algorithm when the machine is inactive. Moreover, a closed loop control algorithm may be implemented when the gaming machine is active, again as determined by software running at the gaming machine, or by analyzing microphone samples. Alternatively, the machine may implement only an open loop algorithm that provides volume adjustment only when the machine is inactive, in which case the adjusted volume is maintained through active periods, then adjusted again at the next inactive period. Moreover, the closed loop algorithm alone may be used, which essentially defaults to the open loop scheme when the machine is inactive.

BRIEF DESCRIPTION OF THE DRAWINGS

The invention is illustrated in the figures of the accompanying drawings which are meant to be exemplary and not limiting, in which like references are intended to refer to like or corresponding parts, and in which.

DETAILED DESCRIPTION OF THE INVENTION

The present invention provides a gaming machine with automatic volume adjustment. In one approach, the invention takes advantage of the fact that humans do not require a sound to be above the ambient noise for them to hear it. This is sometimes referred to as the "cocktail party effect", where people are able to carry on a conversation despite the fact that the ambient noise is often louder than the other person's voice. In this approach, the system described herein learns by observation what the minimum ambient noise level is, averaged over a suitable time period, and then adjusts the sound level of the gaming machine relative to that minimum ambient noise level.

Figure 1A:
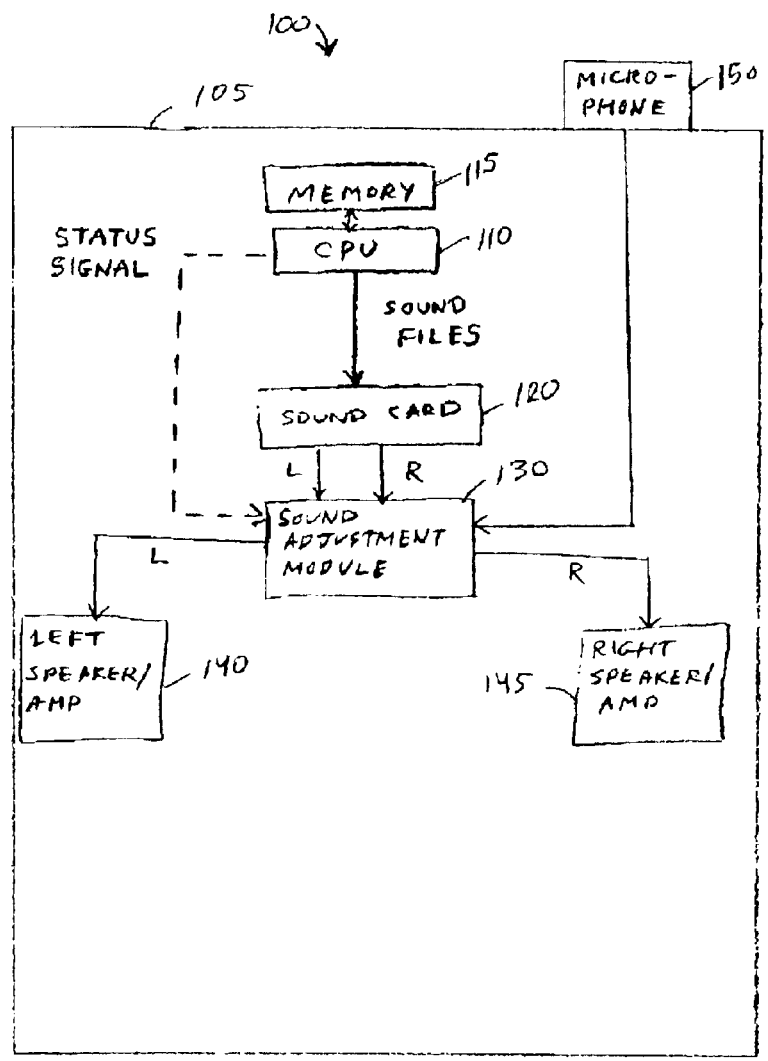
FIG. 1(a) illustrates a gaming machine with an automatic sound adjustment capability in accordance with one embodiment of the present invention.

FIG. 1(a) illustrates a gaming machine with an automatic sound adjustment capability in accordance with one embodiment of the present invention. The gaming machine 100 includes a body 105 having various electronic components for generating sound. Note that the functionality discussed herein may be implemented using software and/or hardware techniques and components known to those skilled in the art. A central processing unit (CPU) 110 with associated memory 115 may provide digital sound files, e.g., in a WAV or MP3 format, to a sound card 120. Particular sound files may be selected by the CPU to enable the gaming machine 100 to make various sounds according to factors such as whether the machine is being played, and whether a jackpot has been won. A typical sound card includes a digital signal processor (DSP) that handles most computations, a digital to analog converter (DAC) for audio leaving the card, a read-only memory (ROM) or Flash memory for storing data, and a jack for connecting to speakers. Moreover, the sound card may have a microphone jack and an analog-to-digital converter (ADC) for converting analog audio signals from the microphone 150. The sound card 120 translates the control signals to left- and right-channel (and any other channels) audio signals that produce sound by exciting the speakers/amplifiers 140, 145.

Figure 1B:
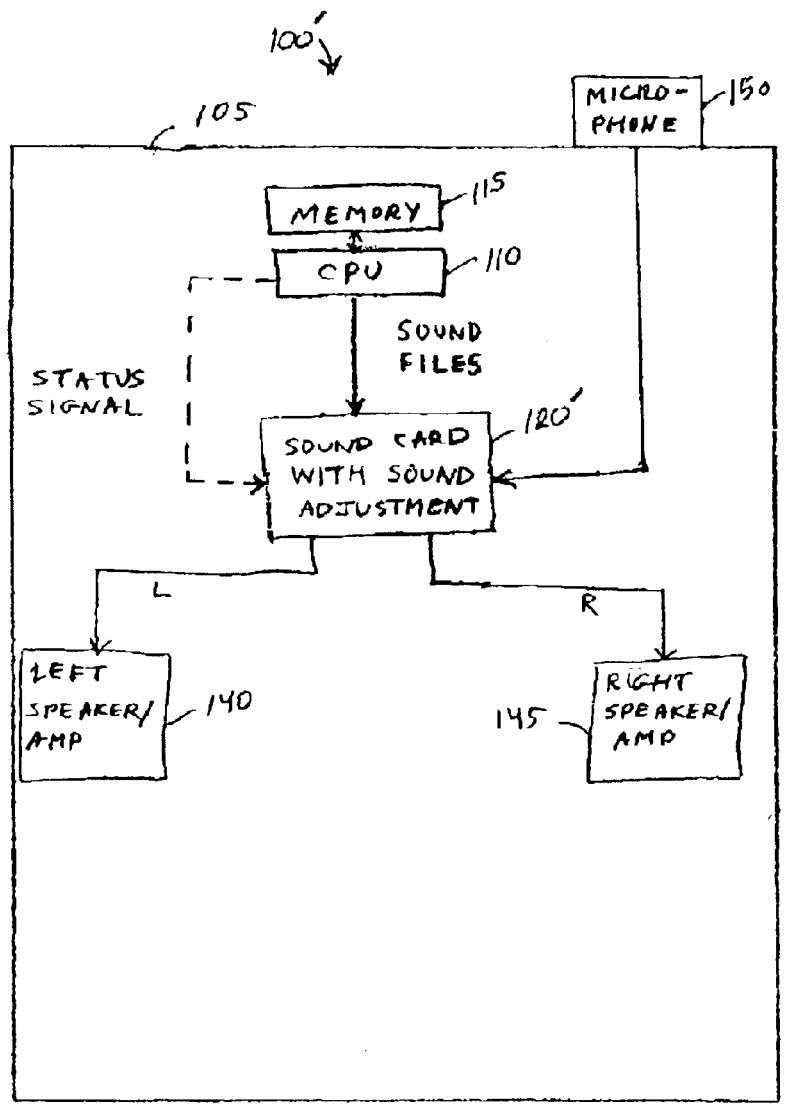
FIG. 1(b) illustrates a gaming machine with an automatic sound adjustment capability in accordance with another embodiment of the present invention.

Note that the sound adjustment functionality of the invention may be carried out using a sound card that can process a microphone signal and provide gain adjustment. In this case, the sound adjustment module 130 may not be needed. For example, refer to FIG. 1(b), which shows a gaming machine 100' with a sound card 120' that provides sound adjustment. However, the module 130 may be needed where the sound card does not have these capabilities (e.g., such as with older model sound cards), in which case the sound card 120 provides left- and right-channel analog audio signals to the sound adjustment module 130, where gain adjustment is applied to provide corresponding volume-adjusted left- and right-channel audio signals for reproduction by the left- and right-channel speakers/amplifiers 140 and 145, respectively.

Note that two audio channels are used to provide a stereo effect in the present example, but fewer or more channels may be used according to the audio quality or effect that is desired. For example, multiple channels of audio may be used to provide multiple sounds such as stereo music, bells and whistles and the like.

The sound card 120' or sound adjustment module 130 implements a volume adjustment algorithm to adjust the volume of the audio output of the machine 100 based on the noise level of an environment in which the machine 100 is located. In particular, the microphone 150 may provide a signal to the sound card 120' or sound adjustment module 130 from which the ambient noise level is determined. One or more microphones may be used, and can be positioned as desired to accurately pick up the ambient noise level. For a gaming machine, the microphone may be located on an outer surface of the body 105 of the machine 100 or otherwise proximate to the machine, or in some other location which is expected to accurately capture the ambient noise level near the machine. For example, the top portion of some gaming machines has lights in an area known as the "candle" where the microphone may be located. Moreover, it is helpful if the microphone is located generally near the user's ear since the volume adjustment should be based on the noise that the user hears. Moreover, the microphone should be in a location that results in a relatively low coupling with the sound emitted from gaming machine's speakers. Moreover, a directional microphone may be used that is aimed appropriately away from the speakers. A wired or wireless link between the microphone and machine body 105 may also be used. The microphone may be added and coupled to the sound card 120' or sound adjustment module 130 using various techniques that should be apparent to those skilled in the art. For example, a hole can be drilled in the body 105 of the machine 100, 100' to hold a microphone, and a wire run within the body 105 from the microphone 150 to a microphone jack at the sound card 120' or sound adjustment module 130.

In one approach, the sound card 120' or sound adjustment module 130 learns when the gaming machine is active, e.g., generating sound by playing a file, based on software running in the CPU 110 that can indicate directly whether the gaming machine is active since the CPU 110 knows when it has provided a sound file to the sound card 120, 120' or sound adjustment module 130. Or, it may be determined that the gaming machine is active by the output samples or signals of the sound card 120 or 120'. That is, when there is an output, the machine is active. The output can be detected by the sound adjustment module, which is either separate from, or combined with, the sound card functions. When there is no output, the machine is inactive. See, e.g., FIG. 10 and related discussion for further information. In either case, when the machine is inactive, an open loop control technique may be used by the sound card 120' or sound adjustment module 130 to adjust the machine's volume setting based on the measured ambient noise level. This setting can then be maintained during a subsequent period in which the machine is active. The open loop approach is advantageous due to reduced complexity and should provide good results since the ambient noise in a casino environment or the like is not expected to change significantly in the short periods of time, e.g., a few minutes, when the gaming machine is continuously active. Alternatively, in a closed loop approach, the volume setting may be adjusted continuously while the machine is active by measuring the real-time ambient noise level and subtracting out the coupled component of the machine. The closed loop approach is advantageous in that it can react to sudden changes in the ambient noise level and adjust with the status signal. Specific volume adjustment techniques are discussed further below.

Moreover, the invention may be implemented in a new gaming machine or by retrofitting an existing gaming machine. In a retrofit, the sound adjustment module 130 may be provided as, e.g., a printed circuit board (PCB) that is connected between an existing sound card, e.g., 120 and speakers/amplifiers, e.g., 140, 145. The sound adjustment module 130 can be designed in accordance with the invention to have various advantages, including low cost, small size and relatively low complexity. Various requirements for the module that can be defined include:

- Manufacturing cost
- Ambient sound volume range (start with 40 dB minimum)
- Output sound volume control range (start with 40 dB minimum)
- Multiple outputs (left and right) shall have the same control signal
- Physical dimensions of the printed circuit board (PCB)
- Maximum distance between the microphone and the PCB
- Power supply voltages available for the PCB
- Power consumption of the PCB
- Manufacturing Requirements
- Connections between the retrofit module and the existing machines, including mounting requirements, and connector requirements
- Operating temperature range (e.g., 0 to +50° Celsius)
- Storage temperature range (e.g., −40 to +85° Celsius)
- Operational and storage humidity is 0 to 95 percent
- Diagnostic indicators—LEDs for fault diagnosis may be provided: one to indicate an active microphone signal, and one to indicate an active gaming machine signal. These have time constants of minutes and help indicate to a technician or installer whether the unit is operational. If the microcontroller fails, these indicators should be off.

A multi-element switch may be provided for control/setup of the microcontroller.

Figure 9:
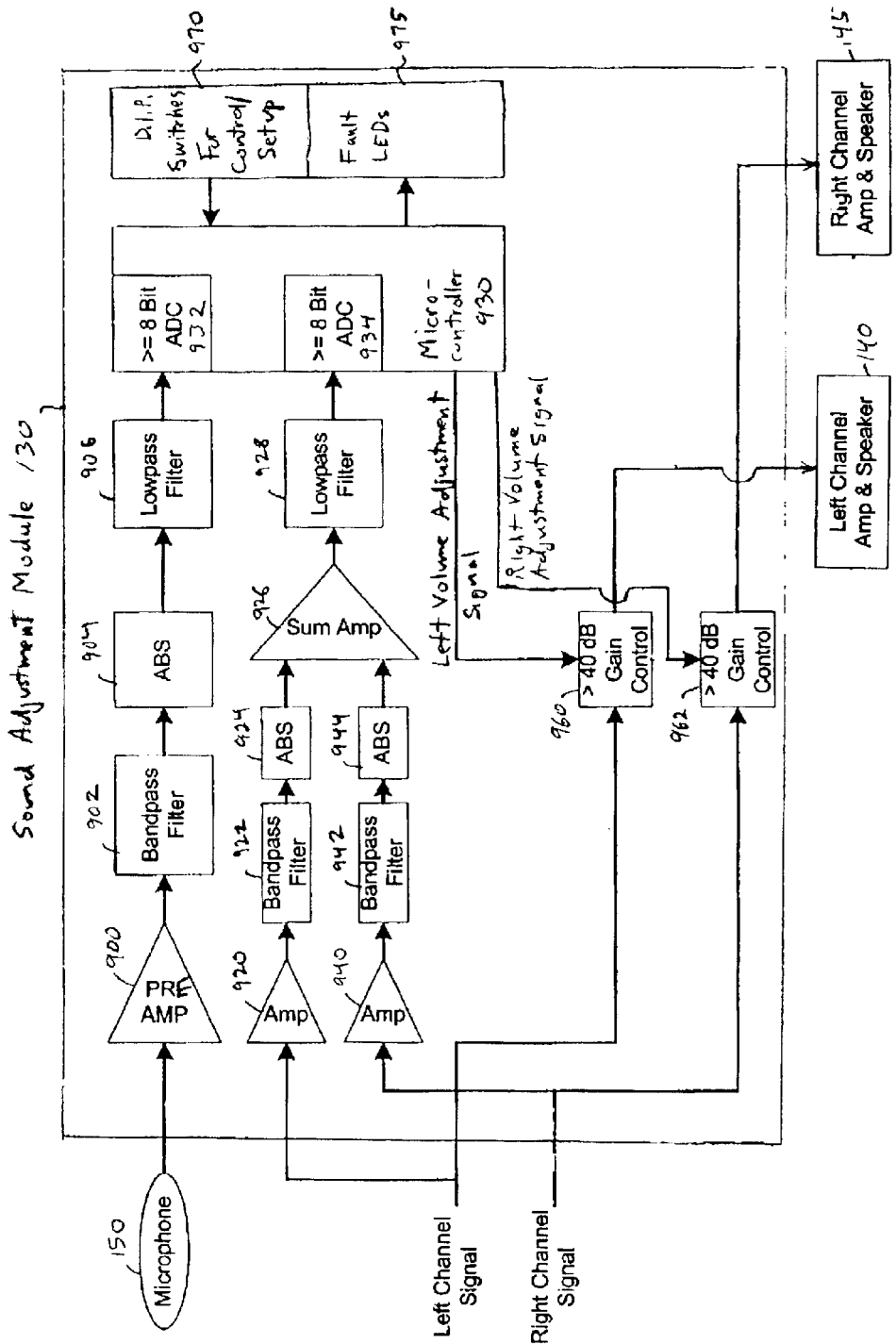
FIG. 9 illustrates a sound adjustment module in accordance with one embodiment of the present invention.

Refer to FIG. 9 for further hardware details of the sound adjustment module 130.

Figure 2:
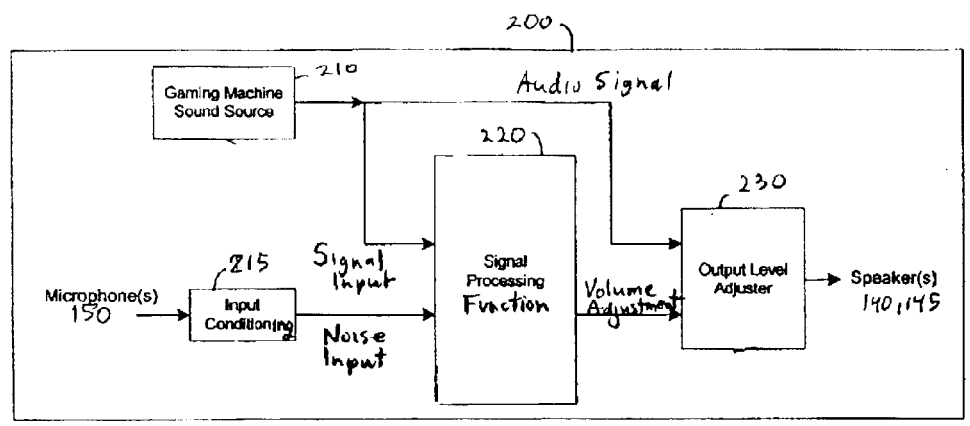
FIG. 2 illustrates a volume adjustment system in accordance with one embodiment of the present invention.

FIG. 2 illustrates a volume adjustment system in accordance with one embodiment of the present invention. The gaming machine sound volume may be automatically increased or decreased in response to the ambient sound level, e.g., as sampled through a microphone. The ambient sound level is determined based on a minimum value, and the gaming machine sound output level is increased, or decreased, based on changes in this minimum level.

The components of the system 200 include the gaming machine sound source 210, e.g., such as a sound card, a function 215 for input conditioning of the noise environment, e.g., from the microphone 150, a signal processing function 220, and an output level adjustment function 230, which provides an adjusted audio signal for exciting the speakers 140, 145.

The signal processing function 220 implements an algorithm that may operate in a variety of conditions where there are different amounts of coupling between the output of the output level adjuster 230 and the input of the input conditioning function 215. Coupling results when the sound generated by the speakers of the gaming machine is picked up as part of the ambient noise at the microphone. As discussed further below, the machine may implement an open loop control algorithm when there is little or no coupling (e.g., the machine is inactive), and a closed loop control algorithm when there is significant coupling (e.g., the machine is active). Alternatively, the machine may implement only an open loop algorithm that provides volume adjustment computations only when the machine is inactive, in which case the adjusted volume is maintained through active periods, then adjusted again at the next inactive period. This approach assumes the machine has inactive periods, which is typically the case for gaming machines. Moreover, the closed loop algorithm alone may be used, which essentially defaults to the open loop scheme when the machine is inactive.

The signal-processing algorithm used at the function 220 may be very broad based to work over a variety of conditions, including a casino environment or other conditions discussed elsewhere herein. As discussed in greater detail below, the signal processing function 220 provides a volume adjustment signal to the output level adjuster 230 for adjusting the output sound volume at the speakers. The output level adjuster 230 adjusts the audio signal from the gaming machine sound source 210 according to the volume adjustment signal. This can be achieved using various components, such as amplifier, potentiometers and the like as will be apparent to those skilled in the art.

Figure 3:
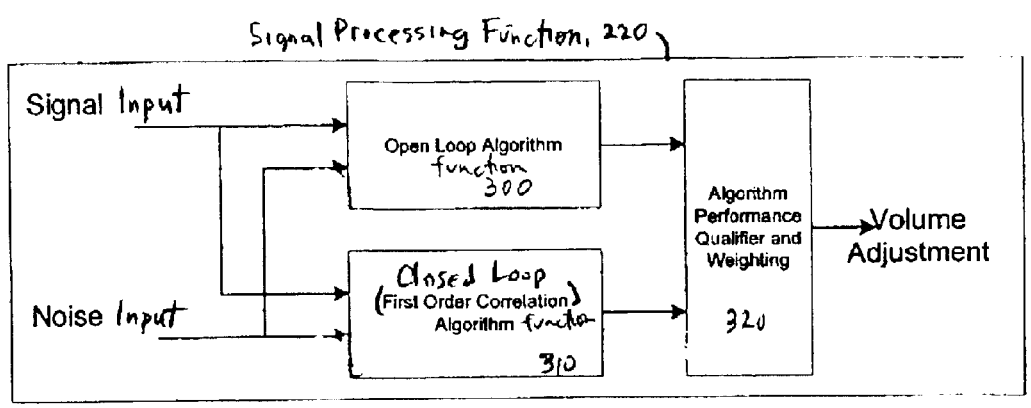
FIG. 3 illustrates a signal processing function in accordance with one embodiment of the present invention.

FIG. 3 illustrates a signal processing function 220 that processes a noise input that is obtained from the input conditioning function 215, and a signal input that is obtained from the gaming machine sound source 210. The signal processing function 220 includes an open loop function 300 and a closed loop function 310, which may implement a first order correlation algorithm. These functions 300, 310 may implement respective algorithms in parallel that operate directly on the sound input and noise input. An algorithm performance and qualifier weighting function 320 applies a weighting algorithm to the outputs of the open loop function 300 and closed loop function 310 to arrive at an output volume adjustment for the gaming machine. Note that the open loop function 300 and closed loop function 310 may be used together or individually, as discussed. Next, all three functions 300, 310 and 320 are described in more detail.

Figure 4:
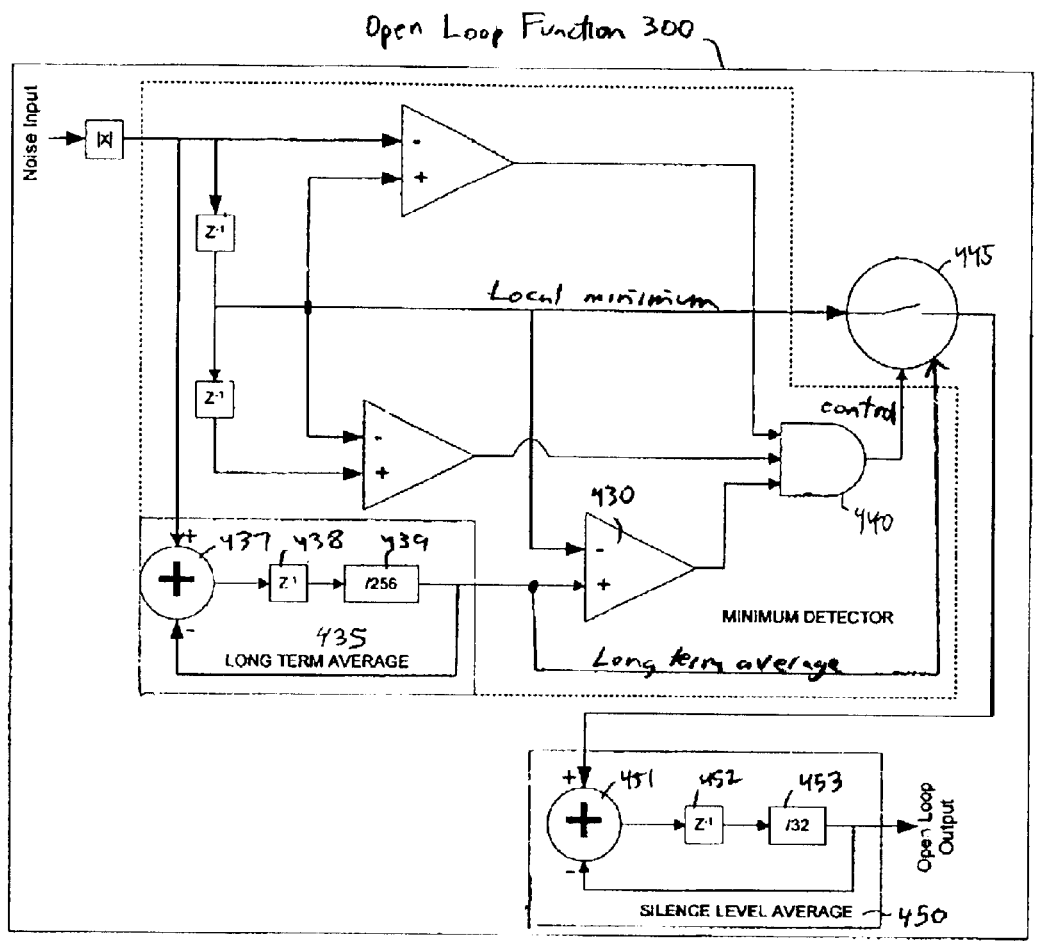
FIG. 4 illustrates an open loop minimum tracking function block diagram in accordance with one embodiment of the present invention.
Figure 5:
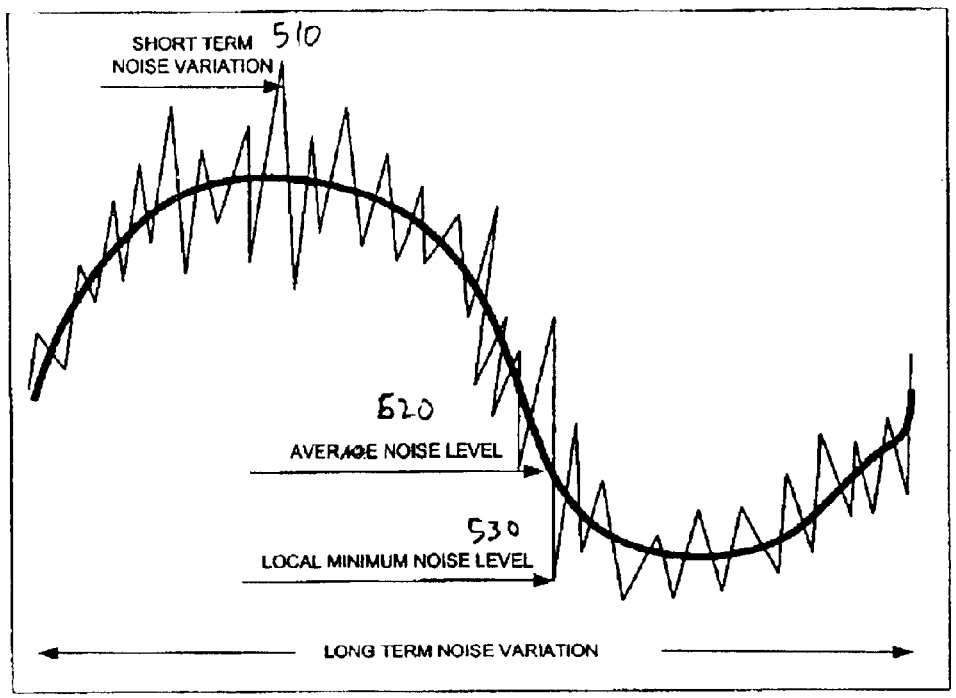
FIG. 5 illustrates an average noise level determined from short and long term noise variations in accordance with one embodiment of the present invention.

FIG. 4 illustrates an open loop minimum tracking function 300 block diagram that enables the output sound volume to increase or decrease with an average of the ambient noise minimum level. The time constants shown for the averaging, as implemented by the selected divisors, are examples only. An example of the average noise level that is determined from short and long term noise variations is shown in FIG. 5. In particular, the noise level versus time chart describes short-term temporal noise variations 510 and the corresponding longer-term temporal noise average 520. For example, the peaks shown in the short-term variation 510 may be a few minutes apart, and the average 520 may be taken over, e.g., five minutes. Data samples may be taken every, e.g., ten seconds. The open loop algorithm described tracks the minimum short-term noise levels, which generally vary according to whether or not the gaming machine and/or neighboring machines are active. The local minimum noise level 530 is the minimum short-term variation within a defined period, and is interpreted as being the ambient noise that is captured by the microphone. By using the lesser of the short-term variation 510 and the average noise level 520 for volume adjustment, the adjustment is based on a sustained noise level rather than peak noise levels. This avoids unnecessary sudden changes in volume that may be undesirable.

As mentioned, the speaker input is used to determine when the game is idle in this case without direct knowledge of the software as to when the game is playing sound, as would be the case with a retrofit kit.

A long term averaging function 435 determines a long-term average of the noise samples. As an example, the average may be taken over 256 samples, but other values may be used. The number of samples used for the average corresponds to a time constant based on the sampling rate. The averaging function 435 includes a summer 437, a delay function 438 and a division function 439. The output of the division function 439 is fed back to the summer 437 for summing with the next input-noise sample.

A comparator 430 detects when the local minimum is below the long-term average. An AND gate 440 output controls a switch 445 to pass the local minimum when it is less than the long term average to a silence level average function 450, which includes a summer 451, a delay 452, and a division function 453. If the local minimum is not less than the long-term average, no value is passed by the switch 445. The switch 445 thus acts as a sample-and-hold function. Note that the division is taken over 32 samples, but this is an example only, as other values may be used. The long-term average and silence average algorithms are preferably both leaky-bucket algorithms. Thus, if a constant signal level is measured, the leaky bucket average will gradually drift down over time.

Figure 6:
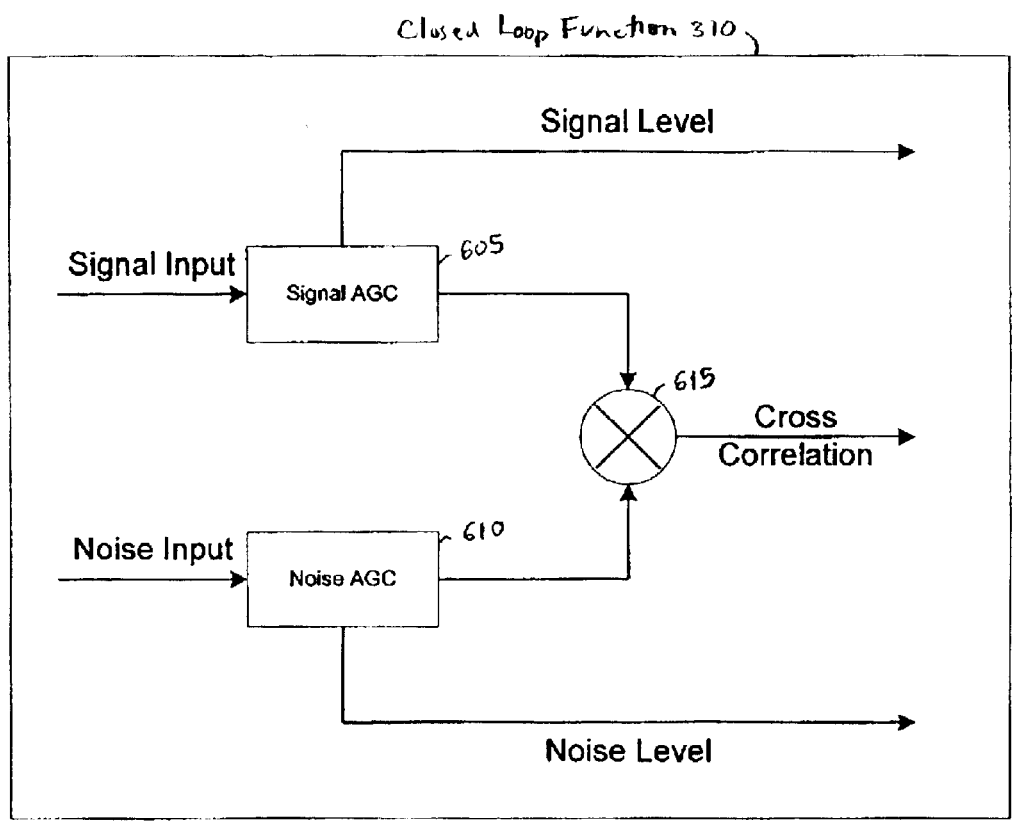
FIG. 6 illustrates a closed loop cross-correlation function in accordance with one embodiment of the present invention.

FIG. 6 illustrates a closed loop cross-correlation signal function 310 which may implement a first order correlation algorithm based on a correlation or coupling between the ambient noise, e.g., as measured by the microphone, and the machine's sound output level, e.g., as measured from the sound card. Cross-correlation is a closed loop control technique that works under some signal-to-noise ratio conditions, in particular, when there is a significant level of coupling between the gaming machine output and the measured ambient noise. The signal power is determined through a cross-correlation of the known signal with a sample of the noise environment. A signal-to-noise ratio metric is determined simultaneously, and that metric is used by the performance qualifier and weighting function 320 to determine the two algorithm's qualification and weighting. The two inputs, signal and noise, pass through respective Automatic Gain Control (AGC) functions 605, 610. The signal AGC function 605 has a signal level output, and the other output is a constant level output that is provided to a multiplier 615 for the cross-correlation. The noise AGC function 610 has a noise level output, and the other output is a constant level output that is provided to a multiplier 615 for the cross-correlation. The constant level outputs are used to optimize the cross correlation calculation, as will be appreciated by those skilled in the art. The signal level and noise level outputs are provided to performance qualifier and weighting function 320 for use in qualifying the cross-correlation output, which is also provided to function 320. The cross-correlation processing described here can be performed in a continuous manner, or in a variety of block processing methods with different correlation periods.

Figure 7:
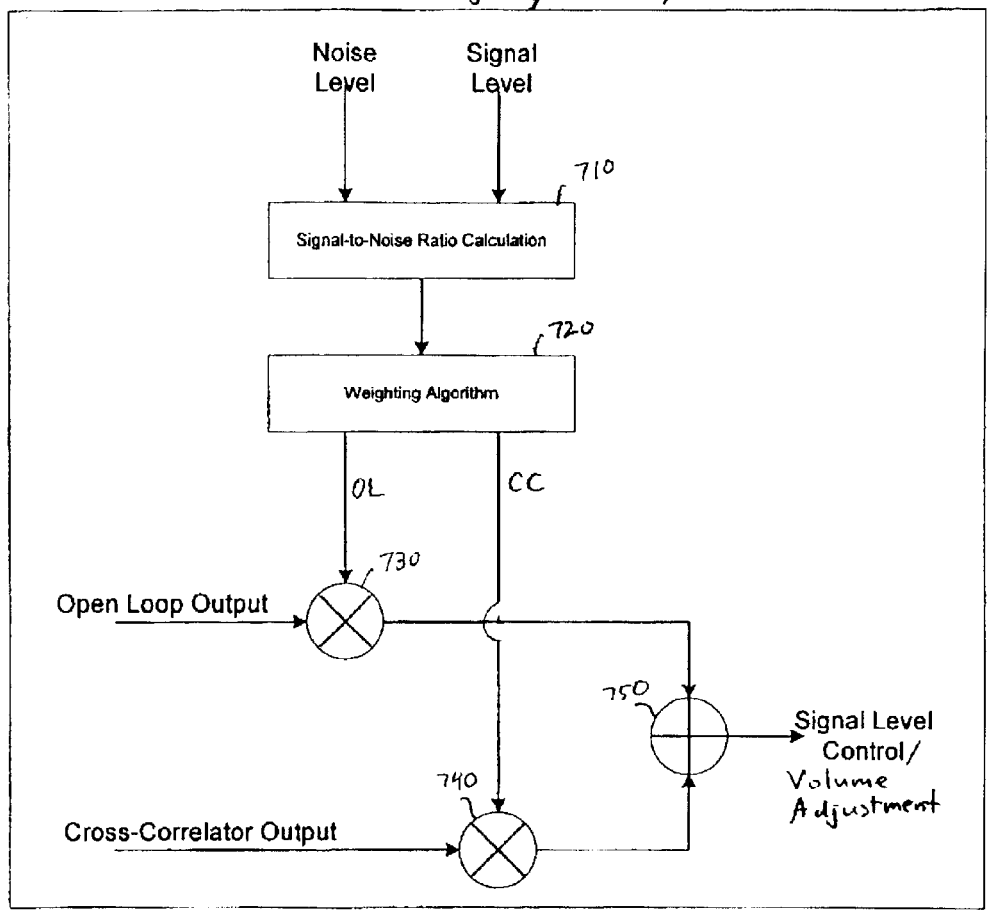
FIG. 7 illustrates a qualification and weighting function in accordance with one embodiment of the present invention.

FIG. 7 illustrates a qualification and weighting function 320, which receives signal and noise levels and the cross-correlator output from the closed loop function 310 (FIG. 6). An open loop output is received from the open loop function 300 (FIG. 4). The signal and noise levels are used for estimating a signal-to-noise ratio (SNR) at SNR calculation function 710. The SNR is used at a weighting algorithm 720 to provide an open loop (OL) weighting signal to multiplier 730, and a cross correlation (CC) weighting signal to a multiplier 740 for weighting the open loop and cross-correlation outputs, respectively. A summer 750 sums the weighted open loop signal and weighted cross-correlation signal to provide a final signal level control/volume adjustment signal, which is used by the output level adjuster 230 as discussed in connection with FIG. 2. In one embodiment of the weighting algorithm 720, a two-position switch is used such that, when the SNR is above a certain threshold level, the correlation output is used as the signal control (i.e., CC=1 and OL=0), and if the SNR is below that level, the open loop output is used as the signal level control (i.e., OL=1 and CC=0). Moreover, the algorithm 720 can switch back and forth between the open and closed loop outputs, e.g., in a time-sliced manner.

Figure 8:
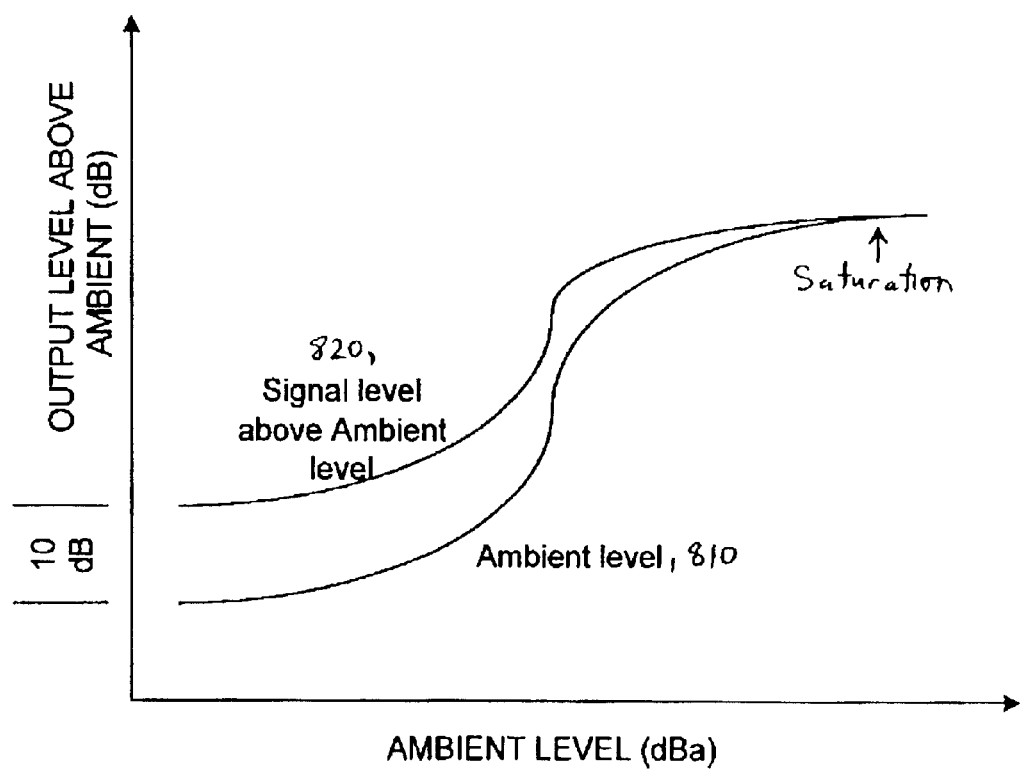
FIG. 8 illustrates a control response in accordance with one embodiment of the present invention.

FIG. 8 illustrates a non-linear control response in accordance with one embodiment of the present invention. In one approach, the output signal level 820 of the gaming machine is set at a level above the ambient noise level 810. The ambient noise level 810 may be determined using the open loop or closed loop control algorithms. The 10-dB signal level above the noise level at low ambient levels is a suggested starting point, and may be adjusted in a field trial. Moreover, note that the output level may merge into the ambient level at higher ambient levels, where no further gain is added, e.g., when saturation is reached. Furthermore, for the automatic gain control (AGC) attack and decay time constants, a starting suggestion is fifteen seconds. Thus, when the ambient noise is low, a larger SNR is targeted than when ambient noise level is high.

FIG. 9 illustrates a sound adjustment module 130 that may be considered to incorporate the functions 220 and 230 of the system 200 of FIG. 2. The module 130 implements a gated AGC algorithm by sampling the ambient noise environment via the microphone 150 with and without the gaming machine output active. The gaming machine signal output activity is used to determine when the microphone sample is the coupled signal from the gaming machine plus noise, or just noise. The sum of the left and right channel signals is used to determine whether the gaming machine is active. Alternatively, this may be determined using software running at the micro-controller 930. The noise level is passed through a nonlinear function (see FIG. 8) to obtain the reference for the feedback loop as a signal level above noise level. A comparison of the reference signal level above noise and the sampled signal level provides a closed loop mechanism for setting the signal power.

In particular, the sound adjustment module 130 processes data obtained via the microphone at a preamplifier 900 and band pass filter 902. The absolute value (ABS) of the output of the filter 902 is taken at a function 904 and provided, as the ambient noise signal, to a low pass filter 906 and an analog-to-digital converter (ADC) 932 of the micro-controller 930 to provide digital data samples having, e.g., eight bits or more. The micro-controller 930 may be of the type used in personal computers, for instance. The left channel signal from the gaming machine, e.g., from the sound card 120, is processed at an amplifier 920, band pass filter 922, and ABS function 924. Similarly, the right channel signal is processed at an amplifier 940, band pass filter 942, and ABS function 944. The outputs of the ABS functions 924 and 944 are summed at a summing amplifier 926, and the output thereof is processed at a low pass filter 928 before being provided to an ADC 934 of the micro-controller 930 as an overall sound signal level. The micro-controller 930 processes the ambient noise and sound signals to provide left- and right-channel volume adjustment signals to gain control functions 960 and 962, respectively. Using software executing in the micro-controller 930, corresponding volume-adjusted audio signals are determined and provided to the left- and right-channel amplifier (amp) and speakers 140 and 145, respectively.

As discussed previously, diagnostic indicators 975 such as LEDs may be provided. Additionally, a multi-clement switch such as an eight-element switch 970 may be provided for control/setup of the micro-controller 930 as will be apparent to those skilled in the art.

Figure 10:
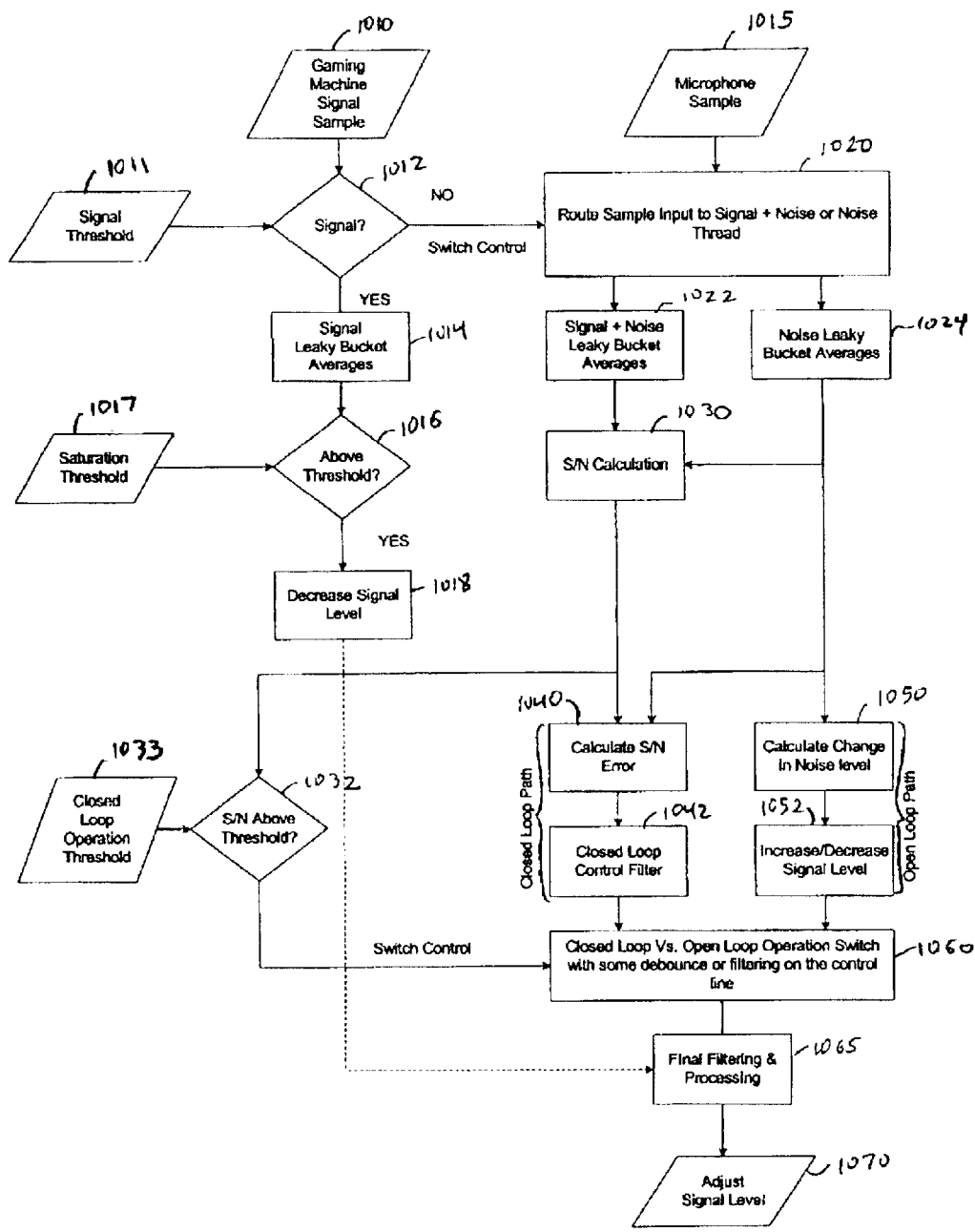
FIG. 10 illustrates an automatic gain control algorithm in accordance with one embodiment of the present invention.

FIG. 10 illustrates an automatic gain control algorithm, which may be carried out using software that executes in the micro-controller 930. As mentioned, the automatic volume adjustment or gain control technique may adaptively select between open loop and closed loop control algorithms for adjusting the gaming machine's sound output based on the ambient noise. The algorithm may be implemented using appropriate software running in the micro-controller 930.

The two main inputs to the algorithm are the gaming machine signal sample 1010, obtained, e.g., via the ADC 932, and the gaming machine signal sample 1015, obtained, e.g., via the ADC 934. At a decision block 1012, the signal sample is compared to a signal threshold (block 1011) to determine if the sample is signal plus noise or just noise. If the signal exceeds the threshold, it includes signal and noise, and it can be concluded that the gaming machine output is active. The signal sample is averaged over a long time at a leaky bucket averaging block 1014 to help determine the saturation condition, where the signal is as large as possible. If saturation conditions arc detected (block 1016) by comparison to a saturation threshold (block 1017), the signal level can be decreased to get out of saturation (block 1018).

Moreover, as mentioned, the determination of whether the gaming machine is outputting sound (e.g. blocks 1011 and 1012) may be made using software executing on the micro-controller 930. In this case, the left- and right-channel inputs used to determine when the game sound signal is above a threshold can be replaced by a software algorithm that provides the answer to the question: Is the game currently making sounds? In this solution, the cross-correlation calculations would be present. One assumption is that the gaming machine will have sufficient periods of silence to allow the noise only (open loop) calculations to determine the background ambient noise level. However, the cross correlation algorithm can cover the case where the noise is determined while the game is making sounds. In this approach, the micro-controller software can be implemented using the soundboard input as the noise collection hardware that is after the microphone. The hardware that will remain in a 'software' solution is the microphone path to the micro-controller.

Regarding the volume saturation check (1016, 1017), avoiding extended volume saturation levels is a key technical problem, in particular, when multiple gaming machines are located in close proximity. For a machine with automatic volume adjustment, there will be a natural attempt to overcome the noise generated by the other machines (which may or may not have the automatic sound adjustment feature), which may cause the machine to saturate at maximum volume and remain at that level. For example, the sound level of one machine may increase in an attempt to overcome louder special sounds that are used at another machine to reward a user when the user wins a game. Moreover, two or more gaming machines with automatic volume adjustment may result in an escalation to saturation for all machines. This is undesirable since the volume may become uncomfortably loud for the user or even damage the machine. Accordingly, the invention provides a mechanism to prevent remaining in saturation by checking for the saturation condition and reducing the gaming machine volume accordingly.

In another possible approach, saturation among multiple gaming machines can be avoided by randomizing the time at each gaming machine for the ambient noise sampling, output volume adjustment, or setting the signal-to-noise ratio target. This also allows a collection of machines to get out of a saturation condition.

The signal plus noise decision (block 1012) acts as a switch control by directing, via block 1020, the microphone samples to either the noise averaging process (1024) or the signal plus noise averaging process (1022), which may use respective leaky-bucket averaging algorithms. Thus, separate averages are maintained according to whether the machine is active. In this way, the average sound output level of the gaming machine can be determined based on a difference between an average of the ambient noise level data obtained when the gaming machine is active and an average of the ambient noise level data obtained when the gaming machine is inactive. At a S/N block 1030, the S/N ratio is estimated from these two averages. Essentially, the S/N ratio may be determined from the relationship ((Signal+Noise)−(Noise))/(Noise). At decision block 1032, the S/N ratio is compared to a closed loop operation threshold (block 1033) to determine how the output level should be adjusted, e.g., using a closed loop system when the S/N ratio exceeds the threshold, or an open loop system when the S/N does not exceed the threshold. The threshold may be determined experimentally. In the closed loop control path, the noise level is used to adjust the reference level. In particular, the S/N error calculation block 1040 has both the S/N estimate and the noise level as inputs to make this adaptive adjustment in the S/N error calculation. Some level of closed loop control filtering 1042 may be required here to maintain stability. The open loop path calculates the change in noise level from sample-to-sample at block 1050, and adjusts the signal accordingly at block 1052. A closed loop vs. open loop operation switch 1060 is controlled according to a switch control that is based on the S/N ratio threshold. At block 1065, the output of the switch 1060 is processed using final filtering and saturation adjustment processing prior to adjusting the output signal level of the gaming machine 1070.

This process addresses the potential problem that the signal plus noise measurement may not be larger than the noise measurement.

Moreover, the invention may track long-term noise statistics so that a decrease in the user level can be sensed. An assumption that the machine output activity increases when the machine is active compared to when it is inactive is implicit in this solution.

Accordingly, it can be seen that the present invention provides a system and method for automatically adjusting the sound volume of a gaming machine based on an ambient noise level. In a particular embodiment, a signal-to-noise ratio is calculated for the sound volume relative to the ambient noise, and a closed loop control algorithm is selected when the SNR exceeds a threshold, while an open loop control algorithm is selected when the SNR does not exceed the threshold. Alternatively, the machine may implement only an open loop algorithm that provides volume adjustment only when the machine's sound output is inactive, in which case the adjusted volume is maintained through active periods, then adjusted again at the next inactive period. Additionally, a saturation back off feature may be implemented to ensure that the sound level of the gaming machine does not escalate to, and remain at, a maximum (saturation) level.

The invention can be used generally in environments that experience changing background noise levels, where a sound source in those environments that has been set for certain volume levels may become difficult to hear, or perceived as too loud, as the background noise changes. An automatic method of adjusting the sound source volume as the background noise level changes can be used as set forth herein to solve this problem. Some examples of environments and situations where this problem may be seen include:

Public areas such as airports, malls and restaurants, or factory or warehouse floors where public address systems or music are sound sources;

Private areas such as automobiles where music or hands free cell phones are sound sources;

Cell phones, which are used in many environments, where the volume that is correct for a quiet environment is not correct for a noisy environment;

Casinos, where the gaming machines are both the sound source for an individual playing a particular machine and the other gaming machines are part of the background noise.

Wireless and wired networks where the signals are both sources, although not sound, and the background noise; and Hearing aids.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. An apparatus for adjusting a level of a sound output of a gaming machine, comprising:
   means for obtaining data regarding an ambient noise level of an environment in which the gaming machine is located;
   means for determining whether the gaming machine is active;
   adjusting means, responsive to the obtaining means, for adjusting the sound output level of the gaming machine;
   a closed loop control algorithm used by the adjusting means when the gaming machine is active; and
   an open loop control algorithm used by the adjusting means when the gaming machine is inactive.

2. The apparatus of claim 1, wherein: said obtaining means comprises at least one microphone.

3. The apparatus of claim 1, wherein: the closed loop control algorithm determines an average sound output level from the ambient noise level data when the gaming machine is active.

4. The apparatus of claim 3, wherein: the average sound output level is determined by subtracting out a coupled component of the sound output level that is present in the ambient noise level data.

5. The apparatus of claim 3, wherein: the average sound output level is determined based on a difference between: (a) an average of the ambient noise level data obtained when the gaming machine is active and (b) an average of the ambient noise level data obtained when the gaming machine is inactive.

6. The apparatus of claim 1, further comprising: means for decreasing the sound output level when it exceeds a saturation threshold.

7. The apparatus of claim 6, wherein: the decreasing means determines when the sound output level has exceeded the saturation threshold by monitoring an output audio signal of a soundboard of the gaming machine.

8. The apparatus of claim 1, wherein: the adjusting means adjusts the sound output level using the open loop control algorithm wherein, the open loop control algorithm changes the sound output level according to a change in an average of the ambient noise level data obtained when the gaming machine is inactive.

9. The apparatus of claim 1, wherein: the open loop control algorithm adjusts the sound output level when the gaming machine is in an inactive period, and maintains the adjusted sound output level when the gaming machine is in a subsequent active period.

10. The apparatus of claim 1, further comprising: calculating means for calculating a signal-to-noise ratio of the sound output level to the ambient noise level according to a ratio of: (a) an average of the ambient noise level data obtained when the gaming machine is active to (b) an average of the ambient noise level data obtained when the gaming machine is inactive; wherein the adjusting means is responsive to the signal-to-noise ratio for adjusting the sound output level.

11. The apparatus of claim 10, wherein: the respective averages of the ambient noise level data are obtained as respective leaky bucket averages.

12. The apparatus of claim 10, further comprising: means for determining whether the gaming machine is active; and a switch responsive to the determining means for selectively routing the ambient noise level data for use in determining said average data (a) and said average data (b).

13. The apparatus of claim 12, wherein: the determining means determines whether the gaming machine is active by monitoring an output audio signal of a soundboard of the gaming machine.

14. The apparatus of claim 12, wherein: the determining means comprises software that indicates whether the gaming machine is active.

15. A method for adjusting a level of a sound output of a gaming machine, comprising:
   obtaining data regarding an ambient noise level of an environment in which the gaming machine is located;
   determining whether the gaming machine is active; and adjusting, responsive to the obtained data, the sound output level of the gaming machine, said adjusting performed using a closed loop control algorithm when the gaming machine is active and an open loop control logarithm when the gaming machine is inactive.

16. The method of claim 15, wherein: the data is obtained using at least one microphone.

17. The method of claim 15, wherein: the closed loop control algorithm determines an average sound output level from the ambient noise level data when the gaming machine is active.

18. The method of claim 17, wherein: the average sound output level is determined by subtracting out a coupled component of the sound output level that is present in the ambient noise level data.

19. The method of claim 17, wherein: the average sound output level is determined based on a difference between: (a) an average of the ambient noise level data obtained when the gaming machine is active and (b) an average of the ambient noise level data obtained when the gaming machine is inactive.

20. The method of claim 15, further comprising: decreasing the sound output level when it exceeds a saturation threshold.

21. The method of claim 20, further comprising: monitoring an output audio signal of a sound board of the gaming machine to determine when the sound output level has exceeded the saturation threshold.

22. The method of claim 15, wherein: the sound output level is adjusted using the open loop control algorithm, and wherein the open loop control algorithm changes the sound output level according to a change in the ambient noise level data obtained when the gaming machine is inactive.

23. The method of claim 15, wherein: the open loop control algorithm adjusts the sound output level when the gaming machine is in an inactive period, and maintains the adjusted sound output level when the gaming machine is in a subsequent active period.

24. The method of claim 15, further comprising: calculating a signal-to-noise ratio of the sound output level to the ambient noise level according to a ratio of: (a) an average of the ambient noise level data obtained when the gaming machine is active to (b) an average of the ambient noise level data obtained when the gaming machine is inactive; wherein the sound output level is adjusted in accordance with the signal-to-noise ratio.

25. The method of claim 24, wherein: the respective averages of the ambient noise level data are obtained as respective leaky bucket averages.

26. The method of claim 24, further comprising: determining whether the gaming machine is active; and responsive to the determining, selectively routing the ambient noise level data for use in determining said average data (a) and said average data (b).

27. The method of claim 26, further comprising: monitoring an output audio signal of a soundboard of the gaming machine to determine whether the gaming machine is active.

28. The method of claim 26, further comprising: using software that indicates whether the gaming machine is active.

29. An apparatus for adjusting a level of a sound output of a gaming machine, comprising:

means for obtaining data regarding an ambient noise level of an environment in which the gaming machine is located;

adjusting means, responsive to the obtaining means, for adjusting the sound output level of the gaming machine; and calculating means, responsive to the obtaining means, for calculating a signal-to-noise ratio of the sound output level to the ambient noise level; wherein the adjusting means selects one of a closed loop control algorithm and an open loop control algorithm according to the signal-to-noise ratio for adjusting the sound output level.

30. The apparatus of claim 29, wherein: the adjusting means selects the closed loop control algorithm when the signal-to-noise ratio exceeds a threshold, and selects the open loop control algorithm when the signal-to-noise ratio does not exceed the threshold.

31. A method for adjusting a level of a sound output of a gaming machine, comprising:

obtaining data regarding an ambient noise level of an environment in which the gaming machine is located;

calculating, using the obtained data, a signal-to-noise ratio of the sound output level to the ambient noise level; and adjusting the sound output level of the gaming machine using one of a closed loop control algorithm and an open loop control algorithm according to the signal-to-noise ratio.

32. The method of claim 31, wherein: the closed loop control algorithm is selected when the signal-to-noise ratio exceeds a threshold, and the open loop control algorithm is selected when the signal-to-noise ratio does not exceed the threshold.

33. An apparatus for adjusting a level of a sound output of a gaming machine, comprising:

means for obtaining data regarding an ambient noise level of an environment in which the gaming machine is located;

means for determining whether the gaming machine is active;

adjusting means, responsive to the obtaining means, for adjusting the sound output level of the gaming machine;

a first control algorithm used by the adjusting means when the gaming machine is active; and a second control algorithm used by the adjusting means when the gaming machine is inactive.

34. The method of claim 33, wherein the first control algorithm comprises a closed loop control algorithm.

35. The method of claim 33, wherein the second control algorithm comprises an open loop control algorithm.

36. A method for adjusting a level of a sound output of a gaming machine, comprising:

obtaining data regarding an ambient noise level of an environment in which the gaming machine is located;

determining whether the gaming machine is active; and adjusting, responsive to the obtained data, the sound output level of the gaming machine, said adjusting performed using a first control algorithm when the gaming machine is active and a second control logarithm when the gaming machine is inactive.

37. The method of claim 36, wherein the first control algorithm comprises a closed loop control algorithm.

38. The method of claim 36, wherein the second control algorithm comprises an open loop control algorithm.

* * * * *

UNITED STATES PATENT AND TRADEMARK OFFICE
CERTIFICATE OF CORRECTION

PATENT NO.     : 6,805,633 B2
DATED          : October 19, 2004
INVENTOR(S)    : Marvin Arthur Hein, Jr., James W. Morrow and Thomas B. Cannon It is certified that error appears in the above-identified patent and that said Letters Patent is hereby corrected as shown below:

Column 3,
Line 6, please delete "arc" and replace with -- are --

Column 9,
Line 27, please delete "multi-clement" and replace with -- multi-element --

Signed and Sealed this

Twenty-second Day of February, 2005

JON W. DUDAS
*Director of the United States Patent and Trademark Office*